United States Patent [19]
Brown

[11] Patent Number: 5,684,805
[45] Date of Patent: Nov. 4, 1997

[54] MICROWAVE MULTIPHASE DETECTOR

[76] Inventor: Anthony Kevin Dale Brown, 26 Equestrian Drive, Kanata, Ontario, Canada, K2M 1C1

[21] Appl. No.: 565,266

[22] Filed: Nov. 30, 1995

[51] Int. Cl.⁶ ................................................. H03D 3/24
[52] U.S. Cl. ........................................... 370/518; 375/373
[58] Field of Search ............................. 370/8–12, 112, 370/204, 205, 211–213, 515, 514, 512, 516, 517, 518, 520, 536, 535, 537, 538, 541, 543, 544; 375/237, 238, 239, 373, 375, 376, 215, 214; 330/254

[56] References Cited

U.S. PATENT DOCUMENTS

| | | | |
|---|---|---|---|
| 4,151,485 | 4/1979 | LaFratta | 331/1 A |
| 5,161,173 | 11/1992 | Nordby | 375/373 |
| 5,185,581 | 2/1993 | Brown | 330/254 |
| 5,301,196 | 4/1994 | Ewen et al. | 370/518 |
| 5,329,559 | 7/1994 | Wong | 375/373 |
| 5,408,351 | 4/1995 | Huang | 370/8 |
| 5,473,633 | 12/1995 | Fisher et al. | 370/8 |

FOREIGN PATENT DOCUMENTS 0 500 014 A2   2/1992   European Pat. Off. ......... H03L 7/089

OTHER PUBLICATIONS

J. Hauenschild, "A 22 Gb/s Circuit and a 32 Gb/s Regenerating Demultiplexer IC Fabricated in Silicon Bipolar Technology", Paper 7.4, Bipolar Circuits and Technology Meeting, IEEE 1992.

*Primary Examiner*—Dang Ton
*Attorney, Agent, or Firm*—Aprilia U. Diaconescu

[57]   ABSTRACT

A microwave multiphase detector for demultiplexing and regenerating data from an incoming data stream includes N data channels and has a data rate R. For recovering data corresponding to a channel M, a detecting unit receives the data stream, detects a sampling phase corresponding to a data transition on channel M and generates a phase width modulated (pwm) pulse, phase modulated with the sampling phase. A digital to analog (D/A) conversion unit converts the pwm pulse to a contributing control voltage and a data regeneration unit provides a recovered data bit for channel (M). The detector is supplied with N variants of a local clock signal with a rate R/N, each variant being phase displaced with ±360°/N from the adjacent variants. A counterbalancing unit is also provided for each channel, such that if a pwm pulse is indeed generated, the contributing voltage for that pulse is compensated for with a balance pulse of opposed amplitude. In this way, the sampling phase corresponding to the respective M data channel may be adjusted by varying the ratio between the amplitudes of the pwm pulse and the balance pulse.

16 Claims, 5 Drawing Sheets

MICROWAVE MULTIPHASE DETECTOR

BACKGROUND OF THE INVENTION

1. Field of the Invention

This invention relates to a multiphase phase detector and more particularly to a multiphase phase detector for demultiplexing and regenerating high frequency data.

2. Background Art

With the advent of the information era and the current interest in broadband data connections to the home, low cost, low power data receivers are required to interface with wideband data transport media which press current integrated circuit technology capabilities to the limits. Such data receivers are required to regenerate digital data at multi-megahertz frequencies and problems of low power, integrated clock recovery mechanisms exist.

One technology which is used to maximize the data rate at which data can be received in a given silicon technology is to use a 1:2 demultiplex circuit at the chip data input. This solution is disclosed in "A 22 Gb/s Circuit and a 32 Gb/s Regenerating Demultiplexer IC Fabricated in Silicon Bipolar Technology", by J. Hauenschild, Paper 7.4, IEEE 1992, Bipolar Circuits And Technology Meeting. For example, the data may be regenerated with two D-type flip-flops whose data inputs are connected to incoming data, but whose clock inputs are connected on the front and rear edges of the clock respectively. In this way, a 2 Gb/s data stream could be regenerated by a 1 Gb/s clock.

SUMMARY OF THE INVENTION

The primary object addressed by this invention is to provide a phase detector for a multiphase voltage controlled oscillator (VCO) utilized for obtaining multiphase data regeneration.

It is another object of this invention to provide a multiphase charge pump circuit for achieving the phase detection of a data stream with respect to a multiple phase VCO whose frequency is less than the associated incoming data rate. In such a circuit, the number of data transitions exceeds the number of clock transitions in a given period of time, and normal techniques for phase locked loop design do not apply.

U.S. Pat. No. 5,185,581 (Brown, issued Feb. 9, 1993 to Northern Telecom Limited), discloses a differential amplifier used for building a VCO which has quadrature phase outputs. The VCO disclosed by this patent may be used in the present invention for providing multiphase clock signals. By clocking four D-type flip-flops off the four phases of such a VCO and connecting the data inputs to a common data stream, a 1:4 demultiplexing circuit is obtained. Such an arrangement would regenerate a 4 Gb/s data stream with a 1 GHz VCO.

Thus, for example, if a silicon process with an $F_T$ of 10 GHz would permit a quadrature phase oscillator to be designed with a maximum guaranteed frequency of 1 GHz, the process would nevertheless potentially support data regeneration up to 4 Gb/s using a totally integrated circuit. Such a circuit would, of course, be limited in operation by the presence of excess phase jitter, as well as excessive jitter of the incoming data.

It is also possible to use VCOs with eight or more output clock phases conceived according to the above identified patent. With an eight or more phase VCO, the maximum data rate that can be regenerated according to this invention is equal to the clock frequency times the number of clock phases available.

It is another object of the present invention to provide a microwave multiphase phase detector which allows adjustment of the phases of the clock transitions, if required, to the right or the left of the center of the data-eye so as to improve the bit error rate (BER) performance.

It is clear that since there are potentially multiple data transitions for each cycle of the VCO, the binary value of the data just prior to the next data transition is not known except by observation of the latched data output of the immediately preceding clock phase. According to the invention, each phase of the clock is compared to the possible occurrence of a phase related data transition with the intent that the phases of the clock transitions are adjusted to be nominally centered midway between the data transitions, that is, in the middle of the data eye.

Accordingly, the invention is directed to a microwave phase detector for demultiplexing and regenerating data for an M-order channel from an incoming data stream including N data channels and having a data rate R, comprising terminal means for providing N variants of a local clock signal with a rate R/N, each variant being phase displaced with ±360°/N from the adjacent variants; a detecting unit for receiving the data stream, detecting a sampling phase corresponding to a data transition on channel M and generating phase width modulated (pwm) pulse, phase modulated with the sampling phase; a digital to analog (D/A) conversion unit for converting the pwm pulse to a contributing control voltage; and a data regeneration unit for providing a recovered data bit for the (M) channel.

An advantage of this invention is that the phase detector operates with a phase locked loop in which the clock recovered from the data is at a submultiple frequency of the data rate, so that high rate data can be demultiplexed and recovered.

Another advantage of this invention is that an accurate adjustment of the data eye sampling point is possible, so that the bit error rate may be lowered. Preferably, the sampling point is arranged to the right in the data eye.

In addition, the design of the phase detector according to the invention rationalizes the gate delays sustained by the data and clock pulses and enables an adjusting placement of the data sampling point in the data eye to minimize the bit error rate of the recovered data.

BRIEF DESCRIPTION OF THE DRAWINGS

The foregoing and other objects, features and advantages of the invention will be apparent from the following more particular description of the preferred embodiments, as illustrated in the appended drawings, where.

DESCRIPTION OF THE PREFERRED EMBODIMENT

Figure 1A:
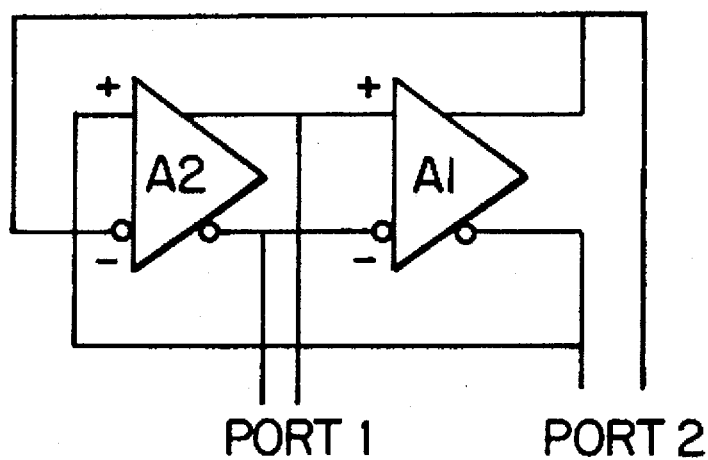
FIG. 1A illustrates a conventional quadrature gyrator resonator with 90° phase shift between ports 1 and 2.

FIG. 1A depicts a quadrature phase VCO according to U.S. Pat. No. 5,185,581 (Brown). The multiphase VCO shown in FIG. 1A may be used for obtaining quadrature phase clocks by taking the output of each port and its inverse. The gyrator resonator oscillates with a 90° phase shift between port 1 and port 2. The VCO comprises two differential amplifiers A1 and A2 which are connected as a resonant circuit. The positive and the negative output terminals of differential amplifier A2 are respectively connected to the positive and negative input terminals of differential amplifier A1, and the positive and negative output terminals of amplifier A1 are respectively connected to the negative and positive terminals of differential amplifier A2.

The VCO of FIG. 1A oscillates at a frequency where the series gain of the amplifiers A1 and A2 is greater than unity and the total phase skiff contributed by the amplifiers A1 and A2 is 180°, a further 180° phase shift resulting from the cross-coupling of the amplifiers A1 and A2. The amplifiers are biased identically, so each contributes a 90° phase shift at the oscillation frequency. Thus, the clock phases are exactly π/2 radians apart. According to one embodiment of the invention, the detector uses local clock signals Φ1 to Φ4, which may be generated with, for example, a gyrator of the type illustrated in FIG. 1A. As indicated above, the phase shift between two adjacent clocks is 90° for a quadrature VCO as shown in FIG. 1A.

For higher data rates, multiple phase gyrators may be used. In the following disclosure and claims, "N" is used to designate the number of the channels in the data stream. The rate of the incoming data stream that may be demultiplexed with an N phase gyrator is equal to the clock frequency times N. The multiphase detector of the invention will then use a gyrator with N variants of the local clock, the phase shift between two adjacent variants being 360°/N. An early adjacent variant is denoted with (M−1) and begins 360°/N before the (M) variant. A late adjacent variant begins 360°/N after the (M) variant.

According to this invention, a data sampling interval is formed between two successive data transitions and a clock eye is formed between two adjacent variants (M−1) and (M) of the local clock. The detector determines a sampling phase, indicating when a data transition occurs within the data eye. Then, a pwm pulse is formed by transferring a data transition pulse with the sampling phase from the data eye to the clock eye.

Figure 1B:
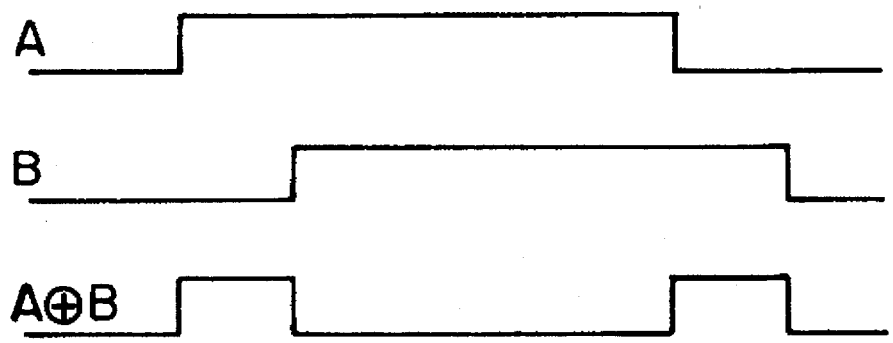
FIG. 1B illustrates the timing diagram of the output of an EXOR circuit with two inputs, one input being a delayed version of the other.

An exclusive OR gate (EXOR) is used to determine the presence of a data transition, one being required for each phase of the clock. FIG. 1B illustrates the timing diagram of the output of an EXOR circuit with two inputs, one input being a delayed version of the other. The output of the EXOR shows a transient pulse of a fixed polarity whenever one of the input signals has a transition of either polarity. In other words, the output gives a positive pulse whenever input 'A' changes polarity.

The microwave multiphase detector of this invention is comprised of N sections, each for recovering data corresponding to one of the clock phases.

Figure 2:
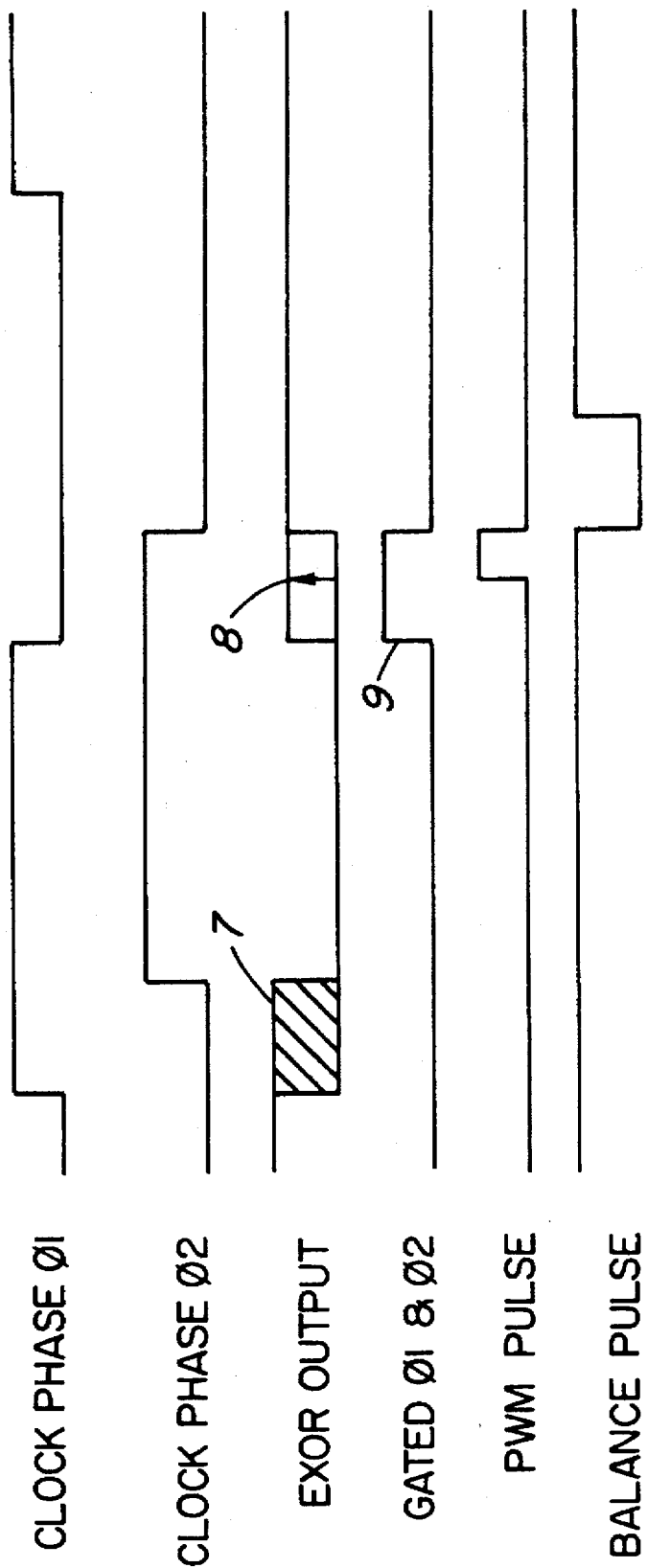
FIG. 2 shows the timing diagram of a phase detector for one data transition.
Figure 3:
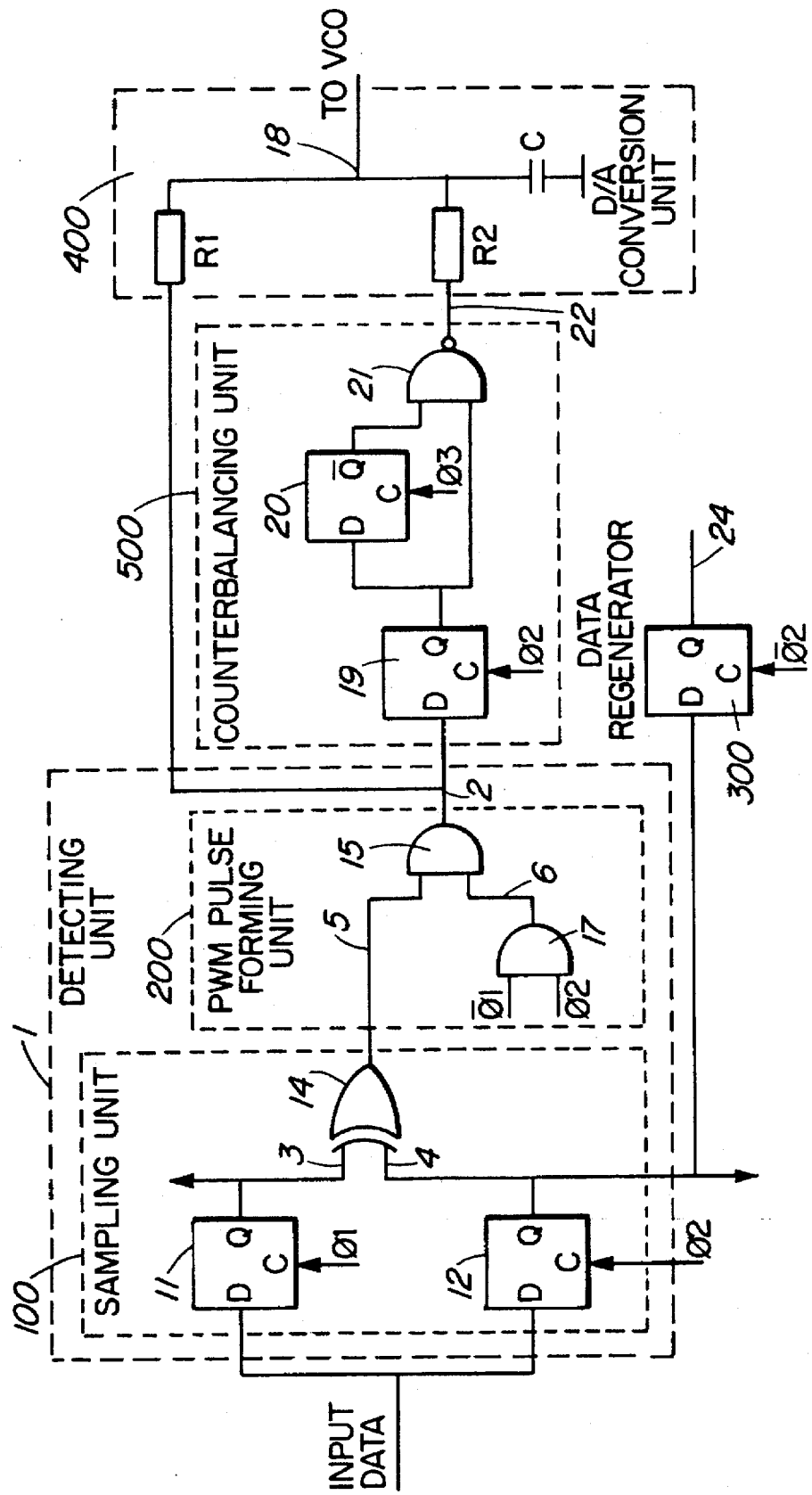
FIG. 3 is the schematic diagram of a multiphase detector circuit, shown for a single phase.

FIG. 2 shows a timing diagram for phase detection of one data transition compared to one clock phase transition, and FIG. 3 shows a schematic diagram of a section of the phase detector for one data transition.

A section M uses clock phases M−1, M and M+1, where M is an integer between 1 and N. M=2 for the section illustrated in FIG. 3, where clocks Φ1 to Φ3 are input to regenerate data corresponding to clock Φ2.

A section comprises a detecting unit 1, including a data sampling unit 100 and a pwm pulse forming unit 200. A section also comprises a data regeneration unit 300, a digital to analog (D/A) conversion unit 400 and a counterbalancing unit 500.

The data sampling unit 100 of detecting unit 1 receives the data stream and clocks Φ1 and Φ2 and provides phase information (the sampling phase) regarding a data transition that occurs between the front edges of these clocks. This interval is defined as the data sampling interval and is illustrated at 7 by the hatched area on FIG. 2. If a transition of data occurs in this interval at sampling point 8, forming unit 200 generates a pwm pulse phase modulated with the sampling phase (the phase of the data transition), by transferring the data transition pulse in the clock eye. The clock eye illustrated in FIG. 2 at 9, is formed between two successive clock variants, Φ1 and Φ2 in the embodiment of FIG. 3. The pwm pulse is input to D/A conversion unit 400, an integrator, to produce a contributing control voltage for the VCO. The contributing voltages for all sections are added in summing node 18 to give the control voltage for the VCO.

The data regenerated for clock M (Φ2 in the circuit shown in FIG. 3) is recovered with a data regeneration unit 300 and used as needed by the receiver.

The control voltage for the VCO is necessary for adjusting the frequency of the local clocks Φ1 to ΦN, with the result that no control voltage should be applied to the VCO when the data transition occurs within a predetermined sampling point in the data sampling interval. To this end, the detector also comprises a counterbalancing unit 500 which applies a balance pulse whenever a pwm pulse is generated in unit 200. The balance pulse is also applied to the conversion unit 400, and has an amplitude and phase selected to compensate for the control voltage given by the pwm pulse, when the transition occurs at the predetermined sampling point.

Counterbalancing unit 500 receives the pwm pulse for clock M, and clock M and M+1, namely Φ2 and Φ3 in FIG. 3. Unit 500 produces a balance pulse that compensates the pwm pulse generated in section M corresponding to clock Φ2 in the case illustrated in these figures.

The position of the pwm pulse formed in unit 200 in the data sampling interval may be adjusted by varying the amplitude of the balance pulses. Thus, if a control voltage is present on summing node 18 due to an adjustment of the amplitude of one or more of the balance pulses of the detector, the frequency of the local clock will increase or decrease, and the sampling position will accordingly move forwards or backwards.

The blocks of the microwave multiphase detector illustrated in FIG. 8 will be further described in detail. As indicated above, in order to determine the binary value of the data just prior to the next data transition, data latched on the immediately preceding clock phase is compared with the current data. This allows adjustment of the phases of clock transitions to be centered between data transitions.

As seen in FIG. 8, two D-latches 11 and 12 are used to sample the data input received at 10, the latches being clocked with two adjacent clocks Φ1 and Φ2 applied on the respective clock input of the D-latches. When the clocks are logic "1", the latches are in 'read' mode and data appearing at 10 is passed to outputs 3 and 4. The state of outputs 3 and 4 of D-latches 11 and 12 after the respective Φ1 or Φ2 clock pulse, is equal to the input D before the respective clock pulse. Since D-latches 11 and 12 are latched in the embodiment illustrated in FIG. 3 on the negative edges of Φ1 and Φ2, respectively, no change in the output occurs after the falling edge of the clock pulse (before the next rising edge).

The outputs of the D-latches 11 and 12 are input via EXOR 14 to the pwm pulse forming unit 200, which provides a pwm pulse at node 2. The exclusive OR gate 14 receives outputs 3 and 4 of D-latches 11 and 12 and gives a pulse on output 5 whenever input 4 changes polarity.

It is apparent in FIG. 2 that a data transition pulse will appear at the output of EXOR 14 if a data transition occurred in the interval between clocks $\Phi_1$ and $\Phi_2$, i.e. in the data sampling interval. Output Q of latch 12 provides phase information on data transitions during the period when the latch 11 has latched on $\Phi_1$, before output Q of latch 12 has latched on $\Phi_2$.

To remove the indeterminate information from the phase information, the output 5 of the EXOR 14 is ANDed in gate 15 with signal 6, obtained by adding the inverse of clock signal $\Phi_1$ with clock signal $\Phi_2$ in AND gate 17. This is illustrated in FIG. 2, row 4.

The resultant pwm pulse obtained at node 2 is illustrated in the 5th row of FIG. 2. It is apparent that the transition takes place in the data sampling interval and that the resulting pulse carries the phase difference information. The pulse will appear at the sampling position if the local clock is in phase with the regenerated data.

The pwm pulse is applied to unit 400, where it is integrated by resistor R1 and capacitor C, to give the contributing voltage for section M=2, which is a fraction of the control voltage on terminal 18. The fraction contributed by the pwm pulse of this section is added in the summing node 18 with the fractions contributed by the other sections to give the control voltage for the VCO. The control voltage depends on the amplitude and length of forming pulses. If a section generates a pulse beginning before the sampling point, a higher voltage will be contributed by that section to the voltage on node 18, and the control voltage will increase. If a section generates a pulse beginning after the sampling point, a lower voltage will be contributed by that section to the voltage on node 18, and the control voltage will decrease. In this way, the frequency of the local clock will be adjusted to the rate of the incoming data stream.

Desirably, if the local clock is synchronized with the recovered data, no signal should be present at summing node 18. Therefore, if a pwm pulse is indeed generated at node 2, a counterbalancing balance pulse should also be generated to compensate for the voltage generated by the pwm pulse. The balance pulse should have a phase and amplitude selected to neutralize the control voltage contributed by a pwm pulse generated by a corresponding section, so that when the recovered data is in phase with the local clock, the VCO maintains its current mode of operation. In the schematic according to this invention, the balance pulse is exactly equal in duration to the clock phase interval, namely the interval (360°/N) between two successive clock pulses $\Phi_1$ and $\Phi_2$, and has the amplitude half of the amplitude of the pwm pulse.

Counterbalancing unit 500 receives the pwm pulse at node 2 and is latched in flip-flop 19 on clock $\Phi_2$. The $\overline{Q}$ output of flip-flop 19 is input to flip-flop 20 clocked with $\Phi_3$. The $\overline{Q}$ output of flip-flops 19 and $\overline{Q}$ output of flip-flop 20 are NANDed in gate 21 to obtain the balance pulse at output 22. The output 22 is high and it goes low when a pwm pulse is detected at node 2 on clock pulse $\Phi_2$, and it goes high again when a high output of flip-flop 19 is detected by flip-flop 20 on clock pulse $\Phi_3$. The balance pulse is also applied to D/A conversion unit 400, where the pulse is converted to a voltage which is added in the control signal at output 18.

The balance pulse generated in unit 500 of FIG. 3 gives, after integration, a voltage which exactly compensates for the voltage produced by the pwm pulse generated in the adjacent section for regenerating data for clock $\Phi_2$ (M=2). In general, the voltage produced by the pwm pulse generated in section M is canceled with a balance pulse generated in section M.

At optimum phase relationship, ignoring gate delays, a clock transition in the center of the data sampling interval will result in a positive pulse at 2 which is exactly half the length of the balance pulse at 22. Using appropriately weighted resistors R1 and R2 in the ratio of 1:2 respectively, the summed integrated charge from the pwm pulse and the balance pulse under these conditions is zero.

Regenerated data for $\Phi_2$ is obtained with data regeneration unit 300 which comprises in the embodiment of FIG. 3, a D-latch clocked with the inverse of clock $\Phi_2$.

As noted above, the circuit of FIG. 3 is theoretically exact, if gate delays are neglected. However, in all very high speed designs, gate delays play an important part in determining the circuit performance. One way of reducing the effect of the gate delays is to use a balanced circuit style, such as CML (current mode logic), or differential CMOS, so that the delays of a signal and its inverse are exactly identical. Thus, $\Phi_1$ has exactly the same delay as $\overline{\Phi}_1$. Again, in the case of very high speed designs, a balanced multiplier for the design of the EXOR gate is preferred. However, in the case of a balanced Gilbert multiplier, the lower multiplier elements are slower than the upper ones, so that the EXOR does not have symmetrical delay paths through its inputs to the output. One way of overcoming this asymmetry is as follows. Assuming that D-latches 11 and 12 are essentially balanced CML multipliers with the clock input being slower than the data input and also that a CML AND gate is a modified multiplier with a fast and slow input, then with reference to FIG. 3:

node 3 is the fast input of EXOR gate 14;
node 4 is the slow input of EXOR gate 14;
variant $\Phi_2$ is the slow input of clocked latch 12;
node 10 is the fast input of latch 12;
node 5 is the fast input of AND gate 15;
node 6 is the slow input of AND gate 15; and
variant $\Phi_2$ is the slow input of AND gate 17.

The rising edge of the pwm pulse is defined by the path: input 10, latch 12, node 4, node 5, node 2; the total delay is "fast"+"slow"+"fast".

The falling edge of the pwm pulse is defined by the path: $\Phi_2$ input of AND gate 17, node 6, node 2; the total delay is "slow"+"slow".

Standard design of CML gates is such that the slow path is twice the delay of the fast path. Consequently, the two paths are accurately matched and the phase relationship of the data input 10 to the clock $\Phi_2$ will be accurately represented by the length of the pwm pulse at 2.

As a result, the data and clock paths are quite accurately matched to within a few tens of picoseconds, typically 30 ps for a bipolar process with $f_T$=10 GHz. This represents a 3% error relative to a 1 ns clock period, corresponding to a pulse width error of the pwm pulse of 24% for a four phase data regeneration system at a data rate of 4 Gb/s, and represents a clock/data pulse alignment error of 15 ps. Although this pulse width modulation error is relatively small, it can be compensated by parametric adjustment of the ratio of resistors R1 and R2. The same resistor rate can also be adjusted for accurate adjustment of the sampling point to obtain the lowest BER. Note that in practical systems, the lowest BER is frequently found to the right of the center of the data sampling interval due to the lossy nature of the transmission medium.

Figure 4:
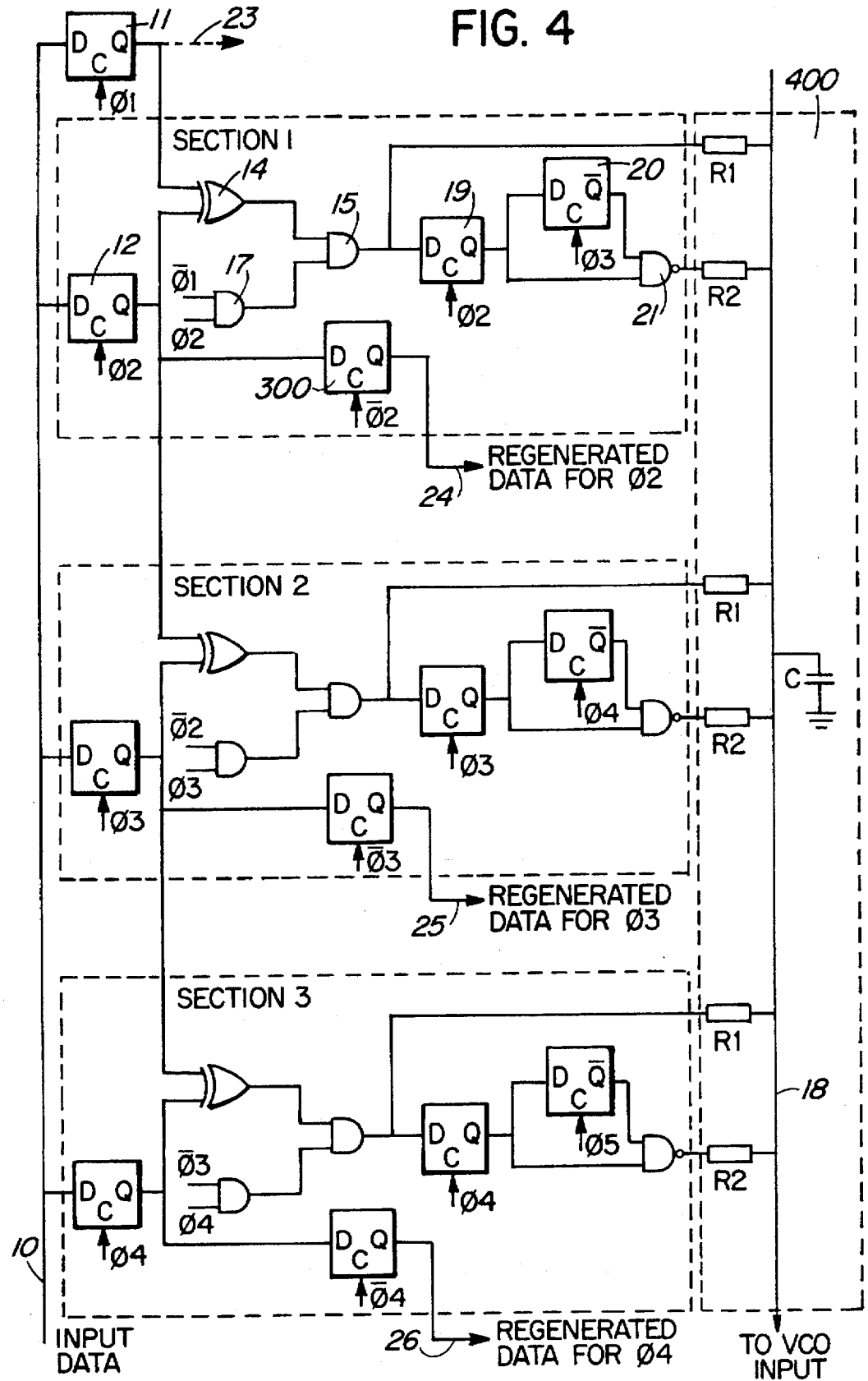
FIG. 4 is the schematic diagram of three adjacent detector sections of an 'N' phase detector.

FIG. 4 is the schematic diagram of three adjacent detector sections of an N phase detector, showing interconnectivity. Input data is applied on terminal 10 to all data sampling units and a control signal indicating whether the regenerated and local clocks are out of phase is obtained at out-put 18.

Generally, a section M includes a detecting unit which generates a pwm pulse for M, a data regeneration unit for separating regenerated data for M clock, and a conversion unit for converting the data transition generated signal into a contributing control voltage. The section M also comprises a counterbalancing unit that produces a balance pulse from the local M and M+1 clocks, to compensate the pwm pulse generated in section M, if the phase of the recovered clocks is correct.

The summing node 18 collects 'N' outputs to generate the control signal, which is applied to the input of the VCO for phase adjustment. Unit 400 comprises the weighting resistors of all sections and a common capacitor connected between output 18 and ground.

Figure 5:
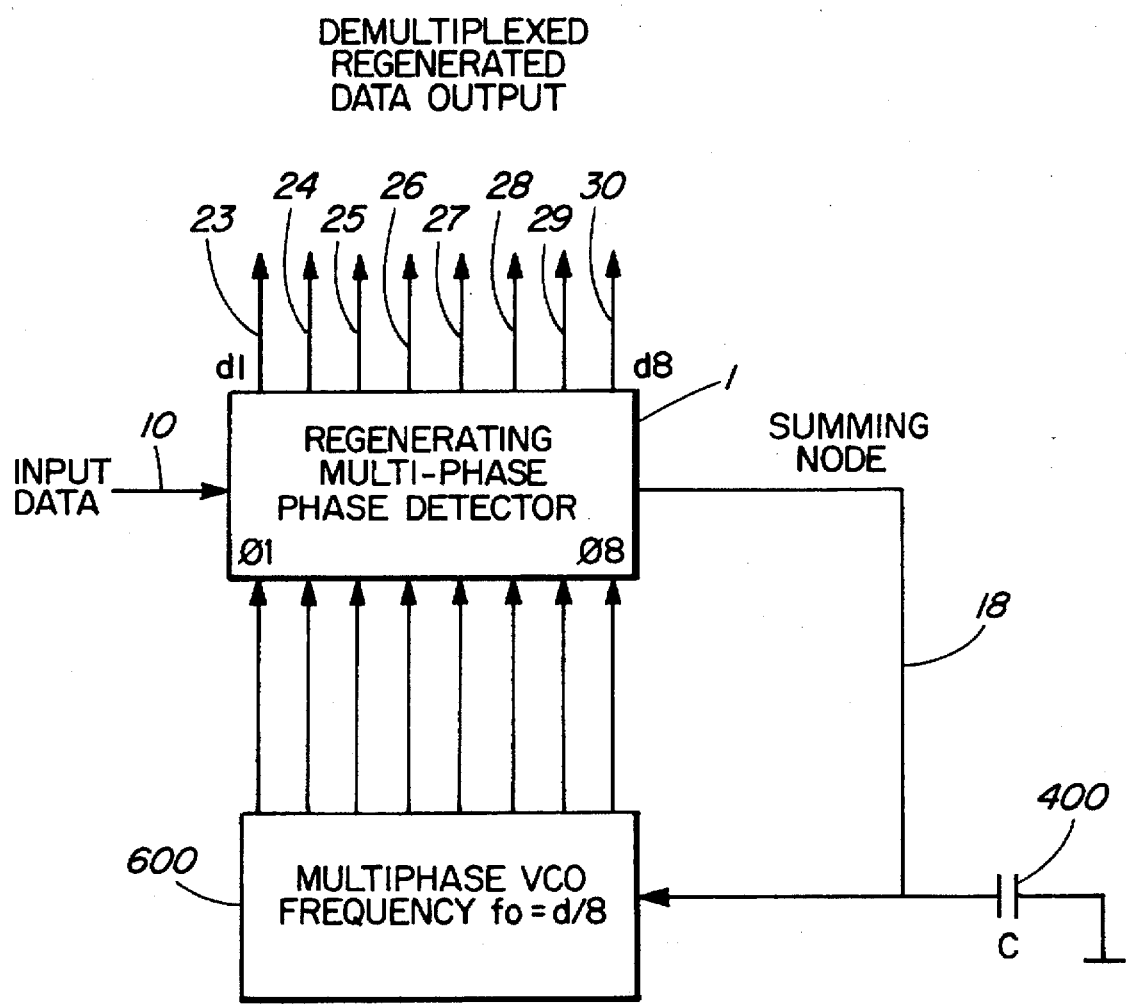
FIG. 5 illustrates a multiphase locked loop with the multiphase VCO of the invention.

FIG. 5 illustrates a block level diagram of the complete phase locked loop incorporating the multiphase phase detector and the multiphase VCO. The input data is received at 10 and the multiphase clock pulses $\Phi_1$ to $\Phi_8$ are used for demultiplexing data on outputs 23 to 30. The control signal is present at summing node 18 whenever the phase of the data differs from the phase of the local clock. This control signal is applied at the input of the VCO 600 which will adjust the phase of the local clock accordingly. Capacitor C is connected between the ground and the summing node.

While the invention has been described with reference to particular example embodiments, further modifications and improvements which will occur to those skilled in the art may be made within the purview of the appended claims, without departing from the scope of the invention in its broader aspect.

What is claimed is:

1. A microwave phase detector for demultiplexing and regenerating data for an M-order channel from an incoming data stream including N data channels and having a data rate R, comprising:

terminal means for providing N variants of a local clock signal with a rate R/N, each variant (M) being phase displaced with +360°/N from an adjacent early (M−1) variant and with −360°/N from an adjacent late (M+1) variant of said local clock signal;

a detecting unit for receiving said data stream, detecting a sampling phase corresponding to a data transition on channel M and generating a phase width modulated (pwm) pulse, phase modulated with said sampling phase;

a digital to analog (D/A) conversion unit for converting said pwm pulse to a contributing control voltage; and a data regeneration unit for providing a recovered data bit for said M-order channel.

2. A detector as claimed in claim 1 further comprising a counterbalancing unit for generating a balance pulse having a predetermined phase relationship with the phase of said pwm pulse and a predetermined amplitude relationship with the amplitude of said pwm pulse, to compensate for said contributing control voltage when said local clock signal and said regenerated data are in phase.

3. A detector as claimed in claim 2, wherein said D/A conversion unit comprises means for adjusting said sampling phase corresponding to said M-order channel by varying said predetermined amplitude relationship.

4. A detector as claimed in claim 2, wherein said detecting unit comprises:

a data sampling unit for establishing a data sampling interval between the front edge of said adjacent early (M−1) variant of said local clock signal and the front edge of said (M) variant of said local clock signal, and forming a data transition pulse corresponding to a data transition on said M-order channel; and means for forming a clock eye and transferring said data transition pulse within said clock eye for forming said pwm pulse for said M-order channel.

5. A detector as claimed in claim 4, wherein said data sampling unit comprises:

a first D-latch clocked on said adjacent early (M−1) variant of said local clock signal for latching a data transition for a (M−1)-order channel, occurring immediately before the front edge of said adjacent early (M−1) variant of said local clock signal;

a second D-latch clocked on said (M) variant of said local clock signal for latching said data transition occurring immediately before the front edge of said (M) variant of said local clock signal; and an EXOR gate connected to the output of said first and second D-latches for forming said data transition pulse within said data sampling interval.

6. A detector as claimed in claim 5, wherein said means for forming comprises:

a first AND gate for establishing said clock eye between the trailing edges of said adjacent early (M−1) and said (M) variants of said local clock signal; and a second AND gate for plating said data transition pulse within said clock eye to form said pwm pulse.

7. A detector as claimed in claim 4, wherein said data regeneration unit comprises a third D-latch for receiving and latching said data transition pulse with said (M) variant of said local clock signal, for recovering data for said (M) variant of said local clock signal.

8. A detector as claimed in claim 6, wherein said counterbalancing unit comprises:

a first flip-flop for receiving said pwm pulse and generating a first pulse on said (M) variant of said local clock signal, for determining the front edge of said balance pulse;

a second flip-flop for receiving said first pulse and generating a second pulse on said adjacent late (M+1) variant of said local clock signal for determining the trailing edge of said balance pulse; and a NAND gate for adding said first and second pulses for forming said balance pulse.

9. A detector as claimed in claim 1, wherein said D/A conversion unit comprises an integrating circuit for integrating said pwm pulse to form said contributing control voltage.

10. A detector as claimed in claim 2, wherein said D/A conversion unit comprises an integrating circuit for integrating said pwm pulse and said balance pulse to form said contributing control voltage.

11. A detector as claimed in claim 2, wherein said D/A conversion unit comprises:

a summing node for assembling said contributing control voltage;

a first resistor for receiving on a first terminal said pwm pulse for said (M) variant of said local clock signal, and connected with a second terminal to said summing node;

a second resistor for receiving on a first terminal said balance pulse and connected with a second terminal to said summing node; and a capacitor connected between said summing node and ground.

12. A detector as claimed in claim 11, wherein said first resistor and said second resistor are selected in a 1:2 ratio, to provide a balance pulse opposed in phase with said pwm pulse and with half the amplitude and double duration of said pwm pulse.

13. A microwave multiphase phase detector for demultiplexing and recovering data for N channels from an incoming data stream with a data rate R, comprising:

terminal means for providing N variants of a local clock signal with a pulse rate R/N, each variant (M) being phase displaced with +360°/N from an adjacent early (M−1) variant and with −360°/N from an adjacent late (M+1) variant of said local clock signal;

a plurality (N) of detecting units, each for a data channel M, where M is an integer between 1 and N, for receiving said data stream, detecting a sampling phase corresponding to a data transition on said channel M and generating a phase width modulated (pwm) pulse, phase modulated with said sampling phase;

a like plurality (N) of first resistors for receiving a like plurality of pwm pulses obtained for all (N) variants of said local clock signal on a first terminal and connected with a second terminal to a summing node;

a like plurality (N) of second resistors for receiving a like plurality of balance pulses obtained for all (N) variants of said local clock signal on a first terminal and connected with a second terminal to said summing node;

a capacitor connected between said summing node and ground for integrating each of said pwm pulses to produce a respective contributing control voltage, and adding said respective contributing control voltages in said summing node to obtain a control voltage; and a like plurality (N) of data regeneration units for providing a recovered data for each of said (N) channels.

14. A detector as claimed in claim 8 wherein said first to third D-latches, said first and second flip-flops, said EXOR gate, said first and said second AND gates, and said NAND gate are current mode logic (CML) circuits.

15. A method for demultiplexing and recovering data for N channels from an incoming data stream with a data rate R, comprising the steps of:

providing N variants of a local clock signal with a pulse rate R/N, each variant (M) being phase displaced with +360°/N from an adjacent early (M−1) variant, and with −360°/N from an adjacent late (M+1) variant of said local clock signal;

for each channel M, where M∈, receiving said data stream and detecting a sampling phase corresponding to a data transition, and generating a phase width modulated (pwm) pulse, phase modulated with said sampling phase generating a balance pulse having a predetermined phase relationship with the phase of said pwm pulse and a predetermined amplitude relationship with the amplitude of said pwm pulse;

adding an analog conversion of said pwm pulse with an analog conversion of said balance pulse to produce a contributing control voltage; and providing a recovered data stream using said (M) variant of said local clock signal; and summing all (N) contributing control voltages obtained for N channels to obtain a control voltage, and controlling said local clock signal with said control voltage.

16. A method as claimed in claim 15, wherein said analog conversion of said balance pulse obtained for an (M)-order channel compensates for said analog conversion of said pwm pulse obtained for an (M−1)-order channel, when said local clock signal is in phase with said recovered data stream.

* * * * *